(12) United States Patent
Takano et al.

(10) Patent No.: US 8,450,715 B2
(45) Date of Patent: May 28, 2013

(54) NONVOLATILE METAL OXIDE MEMORY ELEMENT AND NONVOLATILE MEMORY DEVICE

(75) Inventors: Kensuke Takano, Kanagawa-ken (JP); Katsuyuki Sekine, Mie-ken (JP); Yoshio Ozawa, Kanagawa-ken (JP); Ryota Fujitsuka, Mie-ken (JP); Mitsuru Sato, Mie-ken (JP)

(73) Assignee: Kabushiki Kaisha Toshiba, Tokyo (JP)

(*) Notice: Subject to any disclaimer, the term of this patent is extended or adjusted under 35 U.S.C. 154(b) by 216 days.

(21) Appl. No.: 12/884,000

(22) Filed: Sep. 16, 2010

(65) Prior Publication Data
US 2011/0068316 A1 Mar. 24, 2011

(30) Foreign Application Priority Data
Sep. 18, 2009 (JP) ................................. 2009-216888

(51) Int. Cl.
*H01L 45/00* (2006.01)
(52) U.S. Cl.
USPC ............. 257/4; 257/E45.002; 257/3; 365/148
(58) Field of Classification Search
CPC .................................................... H01L 45/145
USPC .......................................... 257/4, 5, E45.002
See application file for complete search history.

(56) References Cited

U.S. PATENT DOCUMENTS

2006/0245241 A1* 11/2006 Rinerson et al. ............. 365/158
2006/0263289 A1* 11/2006 Heo et al. .................... 423/447.3
2009/0039332 A1* 2/2009 Lee et al. ........................... 257/4
2009/0272961 A1* 11/2009 Miller et al. ...................... 257/4
2011/0249486 A1* 10/2011 Azuma et al. ................. 365/148

FOREIGN PATENT DOCUMENTS

JP 2006-245322 9/2006
JP 2007-308321 11/2007

(Continued)

OTHER PUBLICATIONS

Kenneth Barbalace, Atomic Radius, Environmental Chemisry, 1995.*

(Continued)

*Primary Examiner* — Jerome Jackson, Jr.
*Assistant Examiner* — Paul Budd
(74) *Attorney, Agent, or Firm* — Finnegan, Henderson, Farabow, Garrett & Dunner, L.L.P.

(57) ABSTRACT

According to one embodiment, a nonvolatile memory device includes a plurality of nonvolatile memory elements each of that includes a resistance change film. The resistance change film is capable of recording information by transitioning between a plurality of states having different resistances in response to at least one of a voltage applied to the resistance change film or a current passed through the resistance change film, and the resistance change film includes an oxide containing at least one element selected from the group consisting of Hf, Zr, Ni, Ta, W, Co, Al, Fe, Mn, Cr, and Nb. An impurity element contained in the resistance change film is at least one element selected from the group consisting of Mg, Ca, Sr, Ba, Sc, Y, La, V, Ta, B, Ga, In, Tl, C, Si, Ge, Sn, Pb, N, P, As, Sb, Bi, S, Se, and Te, and the impurity element has an absolute value of standard Gibbs energy of oxide formation larger than an absolute value of standard Gibbs energy of oxide formation of the element contained in the oxide.

18 Claims, 10 Drawing Sheets

FOREIGN PATENT DOCUMENTS

| | | |
|---|---|---|
| JP | 2008-135752 | 6/2008 |
| JP | 2008-243913 | 10/2008 |
| JP | 2008-306157 | 12/2008 |
| JP | 2010-7164 | 1/2010 |
| WO | WO 2008/132899 A1 | 11/2008 |
| WO | WO 2008/149605 A1 | 12/2008 |
| WO | WO 2009/072213 A1 | 6/2009 |

OTHER PUBLICATIONS

Notification of Reason(s) for Refusal issued by the Japanese Patent Office on Feb. 29, 2012, for Japanese Patent Application No. 2009-216888, and English-language translation thereof.

* cited by examiner

NONVOLATILE METAL OXIDE MEMORY ELEMENT AND NONVOLATILE MEMORY DEVICE

CROSS-REFERENCE TO RELATED APPLICATIONS

This application is based upon and claims the benefit of priority from the prior Japanese Patent Application No. 2009-216888, filed on Sep. 18, 2009; the entire contents of which are incorporated herein by reference.

FIELD

Embodiments described herein relate generally to a nonvolatile memory element and a nonvolatile memory device.

BACKGROUND

A resistance change memory (ReRAM, resistance random access memory) is proposed as a fast and high-capacity nonvolatile memory for future application. The resistance change memory has a cell structure with a resistance change film sandwiched between electrodes. The resistance change memory is based on the resistance switching phenomenon to record information.

However, in a ReRAM using transition metal oxide for the resistance change film, the difference between the set voltage for switching from the high resistance state to the low resistance state and the reset voltage for switching from the low resistance state to the high resistance state is small. This presents the problem of being prone to malfunctions.

DETAILED DESCRIPTION

In general, according to one embodiment, a nonvolatile memory device includes a plurality of nonvolatile memory elements each of that includes a resistance change film. The resistance change film is capable of recording information by transitioning between a plurality of states having different resistances in response to at least one of a voltage applied to the resistance change film or a current passed through the resistance change film, and the resistance change film includes an oxide containing at least one element selected from the group consisting of Hf, Zr, Ni, Ta, W, Co, Al, Fe, Mn, Cr, and Nb. An impurity element contained in the resistance change film is at least one element selected from the group consisting of Mg, Ca, Sr, Ba, Sc, Y, La, V, Ta, B, Ga, In, Tl, C, Si, Ge, Sn, Pb, N, P, As, Sb, Bi, S, Se, and Te, and the impurity element has an absolute value of standard Gibbs energy of oxide formation larger than an absolute value of standard Gibbs energy of oxide formation of the element contained in the oxide.

Figure 1:
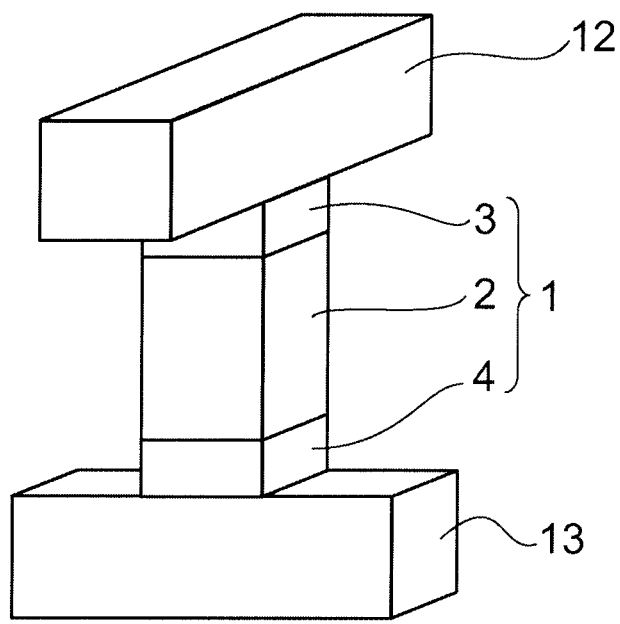
FIG. 1 is a schematic view showing a nonvolatile memory element according to a first embodiment of the invention.

FIG. 1 is a schematic view showing a nonvolatile memory element according to a first embodiment of the invention. The nonvolatile memory element according to this embodiment is a memory element 1 including a resistance change film 2 sandwiched between an anode electrode 3 and a cathode electrode 4. The memory element 1 can record information by transitioning between a plurality of states having different resistances in response to at least one of the applied voltage or the passed current.

The resistance change film 2 has, as a major constituent, an oxide containing at least one element selected from the group consisting of Hf, Zr, Ni, Ta, W, Co, Al, Fe, Mn, Cr, and Nb. Furthermore, the resistance change film 2 is doped with at least one impurity element selected from the group consisting of Mg, Ca, Sr, Ba, Sc, Y, La, V, Ta, B, Ga, In, Tl, C, Si, Ge, Sn, Pb, N, P, As, Sb, Bi, S, Se, and Te.

It is desirable that the doped impurity element have a larger absolute value of standard Gibbs energy of oxide formation, or a larger atomic radius, than Al or the transition metal element contained in the major constituent oxide of the resistance change film 2.

Furthermore, it is desirable that the impurity doped in the resistance change film 2 be an element having a different valence and a lower covalency than Al or the transition metal element contained in the major constituent oxide.

As shown in FIG. 1, the anode electrode 3 and the cathode electrode 4 of the memory element 1 are connected to a word line 12 and a bit line 13, respectively. Thus, a signal is written from a row decoder, not shown, and reading is performed by a sense amplifier.

Figure 2A:
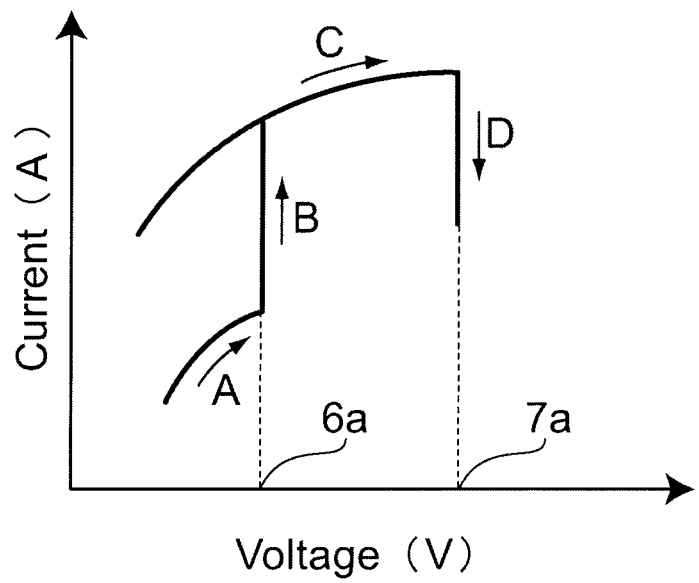
FIGS. 2A and 2B are schematic views describing the set and reset characteristics of the nonvolatile memory element according to the first embodiment.
Figure 2B:
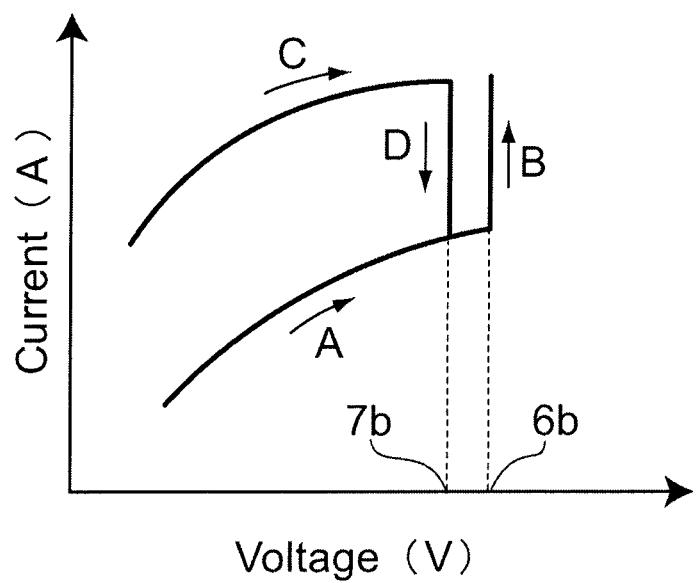

FIGS. 2A and 2B are schematic views illustrating the set and reset characteristics of the memory element 1 according to this embodiment. FIG. 2A shows the set and reset characteristics of the memory element 1. FIG. 2B shows the set and reset characteristics of a memory element in which the resistance change film 2 is not doped with impurity.

In the case of setting the memory element 1, as shown by arrow A in FIG. 2A, the memory element 1 in the reset state is applied with a voltage. Then, the memory element 1 switches to the set state at the set voltage 6a (arrow B). At this time, the resistance change film 2 changes from the high resistance state to the low resistance state.

In the case of resetting the memory element 1, a voltage is applied as shown by arrow C. At the reset voltage 7a, the memory element 1 switches from the set state to the reset state. The resistance change film 2 changes from the low resistance state to the high resistance state.

On the other hand, also in the memory element shown in FIG. 2B, as in the memory element 1, the resistance change film 2 changes from the high resistance state to the low resistance state at the set voltage 6b, and changes from the low resistance state to the high resistance state at the reset voltage 7b.

By comparison between FIG. 2A and FIG. 2B, it is found that the memory element 1 with the resistance change film 2 doped with impurity element has a lower set voltage 6a. This results in a larger difference between the set voltage 6a and the reset voltage 7a, achieving operation less prone to erroneous setting. Furthermore, the application voltage for initializing the ReRAM, i.e., the so-called forming, can be reduced because breakdown voltage of the resistance change film 2 can be lowered.

The reason for the lower set voltage of the memory element 1 shown in FIG. 2A can be considered as follows.

It is supposed that when the resistance change film 2 changes from the high resistance state to the low resistance state by the voltage applied between the anode electrode 3 and the cathode electrode 4, a filament serving as a conduction path is formed in the resistance change film 2. This filament formation is supposed to be a kind of breakdown phenomenon in which oxygen vacancies are generated inside the resistance change film 2. Hence, it is considered that in the memory element 1 shown in FIG. 2A, because the resistance change film is doped with impurity element, oxygen vacancies are generated at a relatively low electric field, and a filament is formed.

It is desirable that the impurity element doped in the resistance change film 2 has a larger absolute value of standard Gibbs energy of oxide formation than Al or the transition metal element contained in the major constituent oxide of the resistance change film 2. More specifically, an impurity element easily combined with oxygen captures oxygen combined with Al or the transition metal element. Thus, the impurity element serves to increase dangling bonds of Al or the transition metal element in the oxide. Furthermore, the dangling bond of Al or the transition metal element supplies a conduction electron into the oxide, and captures oxygen combined with another Al or transition metal element. Thus, the dangling bond serves to disturb the bonding network of the oxide. It is considered that this facilitates filament formation in the resistance change film 2.

Furthermore, it is also useful to dope an impurity element having a larger atomic radius than Al or the transition metal element constituting the major constituent oxide. This is because such an impurity element disturbs the bonding network of the oxide and facilitates filament formation. Furthermore, it is desirable to dope an impurity element having a larger atomic radius and a larger absolute value of standard Gibbs energy of oxide formation than Al or the transition metal element.

Furthermore, it is desirable that the impurity element be an element being different in valence from Al or the transition metal element constituting the oxide, and having a lower covalency than the transition metal element. The reason for this is as follows. If the valence of the impurity element is different from the valence of the transition metal element, then when the transition metal element is replaced by the impurity element, a conduction electron or hole is supplied into the oxide. Furthermore, if the impurity element has a lower covalency, the bonding network is disturbed more easily, facilitating filament formation. In fact, no decrease in the set voltage is observed even if the transition metal oxide is doped with Al, having high covalency, as an impurity element.

Figure 3A:
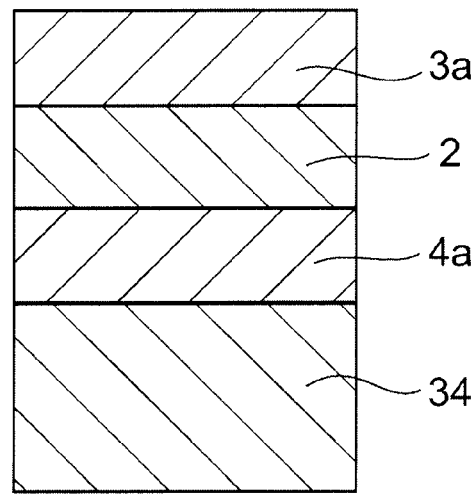
FIGS. 3A to 3C are cross-sectional views schematically showing a process for manufacturing the nonvolatile memory element according to the first embodiment.
Figure 3B:
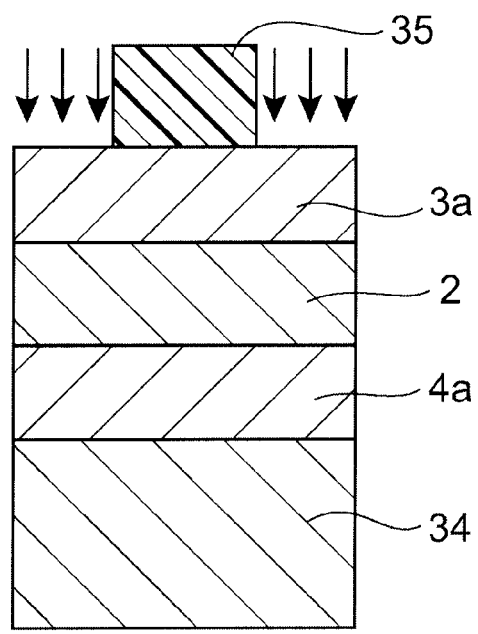
Figure 3C:
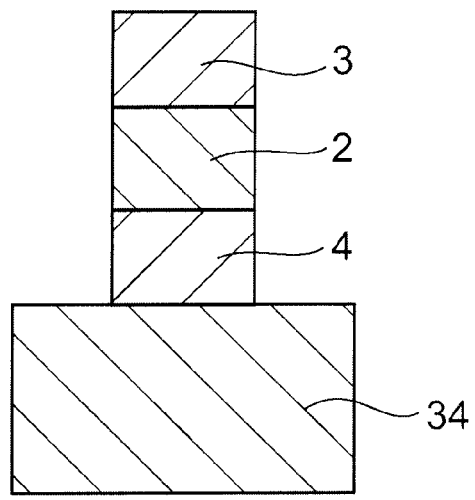

FIGS. 3A to 3C are cross-sectional views schematically showing a process for manufacturing the memory element 1 according to this embodiment.

First, as shown in FIG. 3A, a lower electrode layer 4a, a resistance change film 2, and an upper electrode layer 3a are stacked in this order on the surface of a semiconductor substrate 34.

On the surface of the semiconductor substrate 34, bit lines 13, not shown, and an insulating layer for insulation between the bit lines 13 are provided. Furthermore, various control circuits and the like can be provided therebelow. On the other hand, in the case of forming the memory elements 1 in multiple layers (see FIG. 4), it is possible to use a semiconductor substrate including memory elements, word lines, and an interlayer insulating film for insulation between the memory elements and word lines.

The lower electrode layer 4a and the upper electrode layer 3a can be formed by e.g. sputtering. Alternatively, CVD (chemical vapor deposition) and ALD (atomic layer deposition) can also be used. The material can be a metal such as W, Ta, and Cu, a nitride or carbide such as TiN, TaN, and WC, or polysilicon highly doped with impurity element.

On the other hand, the resistance change film 2 can be formed by sputtering, CVD, or ALD. In the case of using sputtering, the so-called reactive sputtering can be used. In the reactive sputtering, oxygen and a gas containing impurity (such as arsine, phosphine, diborane, and boron trichloride) are introduced into a reaction chamber, and film formation is performed by sputtering a prescribed metal target. On the other hand, in the case of using CVD or ALD, film formation is performed while a raw material gas for growing a metal oxide and a gas containing an impurity element are mixed and introduced into a reaction chamber. Furthermore, it is possible to use the method of forming a metal film and then performing heat treatment in an atmosphere containing oxygen and an impurity element to form a metal oxide film.

The doping of an impurity element can be performed also by ion implantation. In this case, after forming a resistance change film 2 not doped with impurity element, an impurity element is introduced into the film by ion implantation. For instance, in the case of a thin resistance change film 2 of 10 nm or less, a desired impurity can be introduced at a low energy of approximately several keV.

The resistance change film 2 can be made of a metal oxide, typically a transition metal oxide. In particular, it is desirable to use a thin film having, as a major constituent, an oxide containing at least one element selected from the group consisting of Hf, Zr, Ni, Ta, W, Co, Al, Fe, Mn, Cr, and Nb. For instance, with regard to the structure of the oxide, a binary oxide represented by $M_xO_y$ (M: metal, O: oxygen) can be used. Specific examples include bivalent metal oxides such as NiO and CoO, trivalent metal oxides such as $Al_2O_3$, tetravalent metal oxides such as $TiO_2$, $HfO_2$, and $ZrO_2$, and pentavalent metal oxides such as $Ta_2O_5$. Furthermore, it is also possible to use a ternary metal oxide represented by $A_\alpha M_\beta O_\gamma$ (A, M: metals, O: oxygen), and quaternary or higher metal oxide.

The impurity element doped in the resistance change film 2 is illustratively at least one element selected from the group consisting of Mg, Ca, Sr, Ba, Sc, Y, La, V, Ta, B, Ga, In, Tl, C, Si, Ge, Sn, Pb, N, P, As, Sb, Bi, S, Se, and Te. It is desirable that the doping amount of the impurity element be controlled so as to be $1 \times 10^{14}$ $cm^{-2}$ or more. Furthermore, to dope an impurity different in valence from Al or the transition metal element constituting the oxide, a tetravalent binary metal oxide, for instance, can be doped with trivalent elements such as B and Ga, or pentavalent elements such as P, As, and Sb.

FIG. 3B shows the step for etching the stacked lower electrode layer 4a, resistance change film 2, and upper electrode layer 3a by RIE (reactive ion etching). An etching mask 35 patterned in a prescribed shape is formed on the surface of the upper electrode layer 3a. The etching mask 35 can illustratively be made of photoresist.

After etching by RIE and processing into the shape shown in FIG. 3C, the etching mask 35 is removed. Thus, the memory element 1 is completed. In the case where the etching mask 35 is made of photoresist, the remaining etching mask 35 can be removed by oxygen ashing after the etching. In the memory element 1 shown in FIG. 3C, the lower electrode layer 4a is processed into a prescribed shape to form a cathode electrode 4, and the upper electrode layer 3a constitutes an anode electrode 3.

Figure 4:
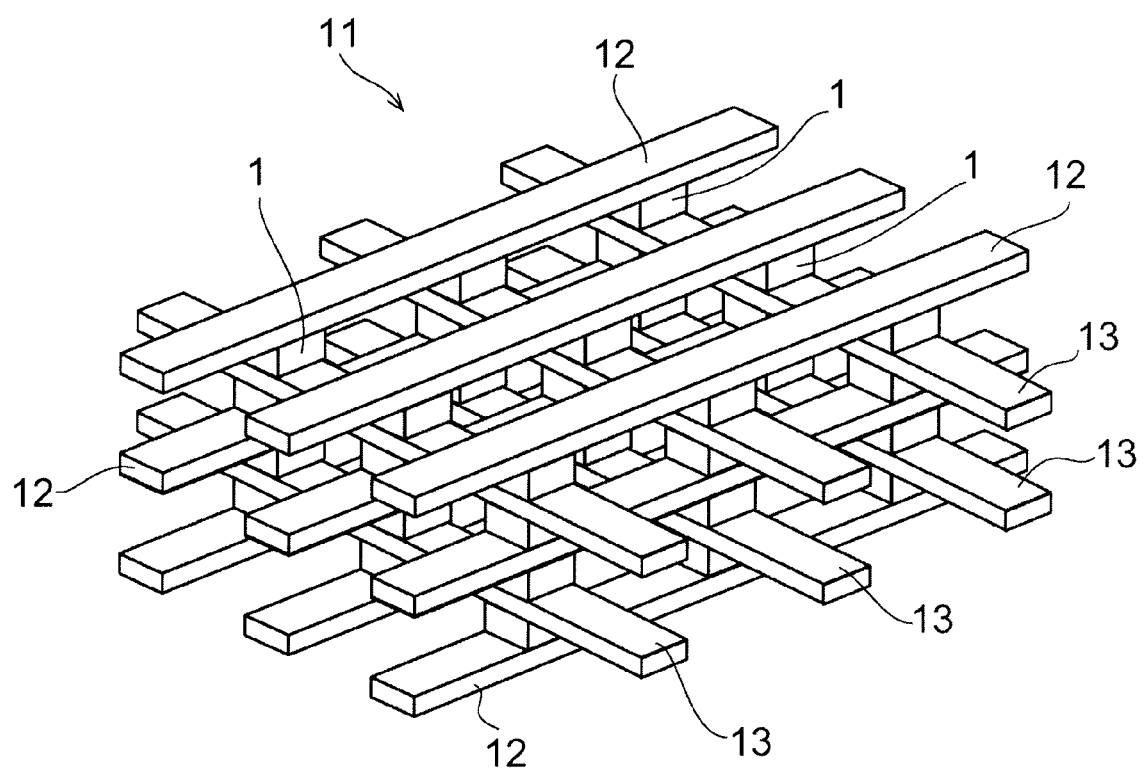
FIG. 4 is a schematic view showing part of a nonvolatile memory device according to the first embodiment.

FIG. 4 is a schematic view showing part of a nonvolatile memory device 10 according to this embodiment. The nonvolatile memory device according to this embodiment has a structure in which the memory elements 1 serving as nonvolatile memory elements are stacked in multiple layers. FIG. 4 schematically shows its memory element array unit 11.

In the example shown in FIG. 4, the memory elements 1 are stacked in four layers. A plurality of interconnections connected to the memory elements 1, i.e., word lines 12 and bit lines 13, are located between the adjacent layers. An interlayer insulating film is formed between the memory elements 1, between the word lines, and between the bit lines.

Figure 5:
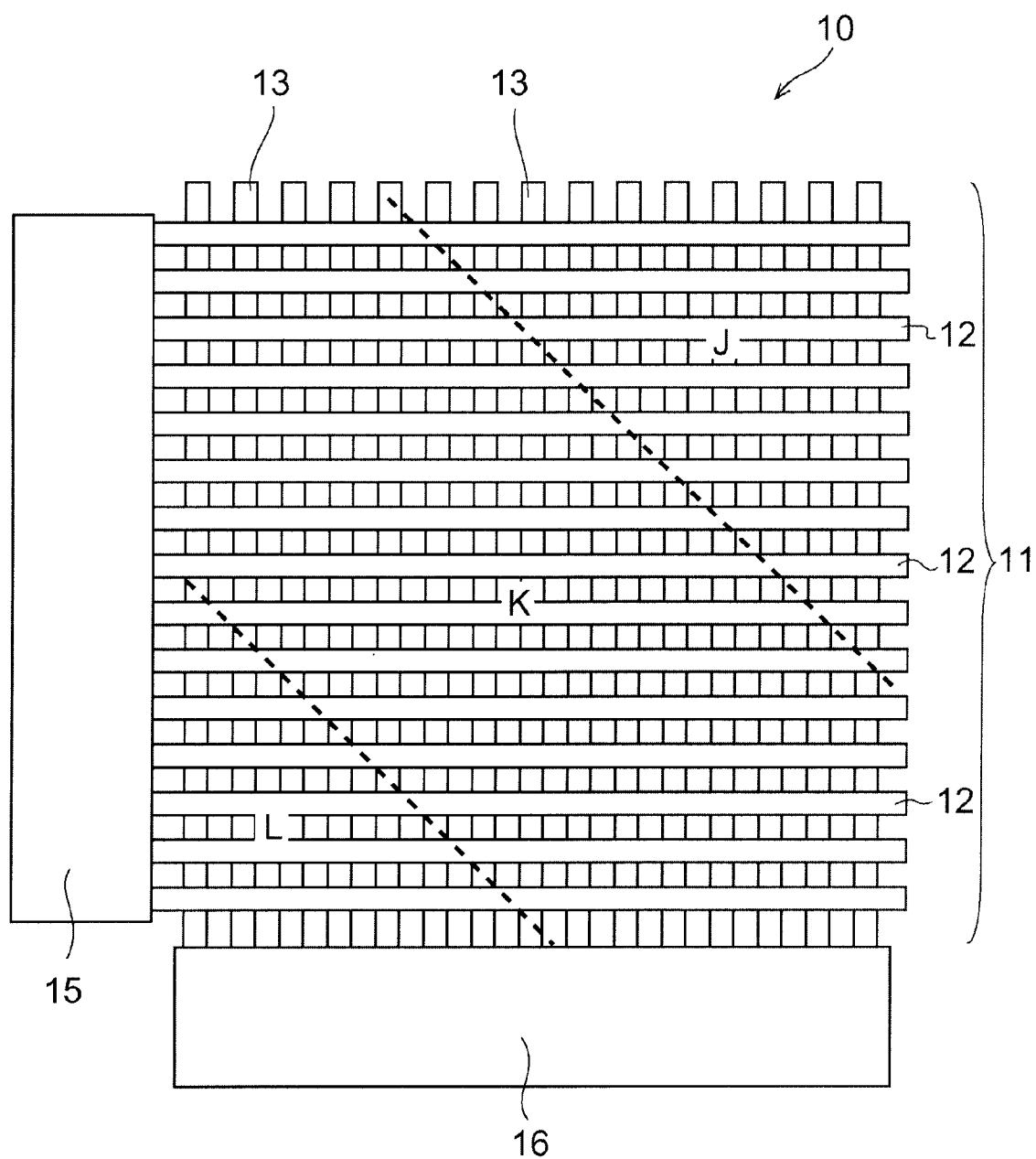
FIG. 5 is a plan view schematically showing the configuration of a nonvolatile memory device according to the first embodiment.

FIG. 5 is a plan view schematically showing the configuration of the nonvolatile memory device 10 according to this embodiment. The nonvolatile memory device 10 includes a memory element array unit 11 with word lines 12 and bit lines 13 arranged crosswise therein, a row decoder 15 with the word lines 12 connected thereto, and a sense amplifier 16 with the bit lines 13 connected thereto.

At each crossing position of the word line 12 and the bit line 13 of the memory element array unit 11, a memory element 1 is provided as shown in FIG. 4. The row decoder 15 applies a voltage to each word line 12 to cause the memory element 1 to store information by setting the memory element 1. On the other hand, the sense amplifier 16 reads the information stored in the memory element 1 via each bit line 13. At this time, in a element for storing information in relationship to the state change of the resistance change film 2, as in the memory element 1 according to this embodiment, the operation of the element is affected by the interconnection resistance of the word line 12 and the bit line 13 connected to the memory element 1 subjected to writing and reading.

For instance, the interconnection resistance is high in the region J far from the row decoder 15 and the sense amplifier 16 shown in FIG. 5. However, the interconnection resistance is low in the region L near the row decoder 15 and the sense amplifier 16. The interconnection resistance is intermediate in the intermediate region K between the regions J and L. Hence, it is desirable that the set voltage and the reset voltage be applied to the memory element located in each region while factoring in the interconnection resistance of the word line 12 and the bit line 13 connected thereto.

For instance, in the region J far from the row decoder 15 and the sense amplifier 16, because the interconnection resistance is high, the voltage drop in the interconnection portion is large. Hence, it is desirable that the input voltage for switching the memory element 1 be increased by the amount of voltage drop in the interconnection portion. On the other hand, in the region L near the row decoder 15 and the sense amplifier 16, because the voltage drop in the interconnection portion is small, it is only necessary to input the voltage required to switch the memory element 1. Thus, a different voltage is applied from the row decoder 15 to each memory element 1 to operate the memory element array unit 11, thereby slowing down the operating speed of the row decoder 15. Consequently, acceleration of the operation of the nonvolatile memory device 10 may be limited. In this context, it is desirable that memory elements 1 having a resistance change film containing more impurity than those in the other regions be located in the region J to decrease the set voltage by the amount of voltage drop due to interconnection resistance. Thus, the voltage inputted from the row decoder 15 to the memory element array unit 11 can be made uniform, thereby accelerating the row decoder 15 and achieving fast operation of the nonvolatile memory device 10.

According to this embodiment, the set voltage of the memory element 1 can be controlled by varying the amount of impurity element doped in the resistance change film 2. More specifically, in the nonvolatile memory device 10 according to this embodiment, it is desirable that the amount of impurity doped in the resistance change film 2 of the memory element 1 located in the region J be relatively large, and that the amount of impurity element doped in the resistance change film 2 of the memory element 1 located in the region K and the region L be smaller in this order. Specifically, this is realized by using ion implantation to vary the amount of impurity element doped in each of the regions J, K, and L of the memory element array unit 11 to compensate for the amount of voltage drop in the interconnection resistance.

Figure 6A:
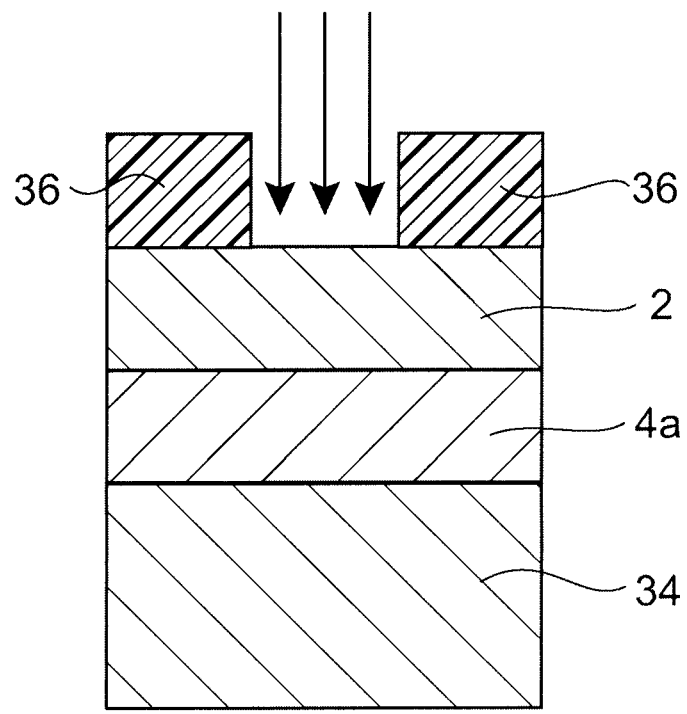
FIGS. 6A and 6B are cross-sectional views schematically showing part of a process for manufacturing the nonvolatile memory device according to the first embodiment.
Figure 6B:
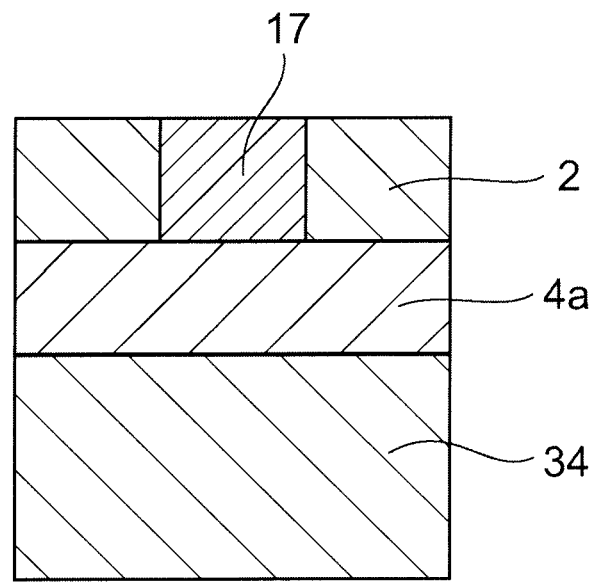

FIGS. 6A and 6B are cross-sectional views schematically showing part of a process for manufacturing a nonvolatile memory device according to this embodiment.

As shown in FIG. 6A, a lower electrode layer 4a and a resistance change film 2 are formed on a semiconductor substrate 34. Then, an implantation mask 36 is formed, and an impurity element is implanted into a desired impurity doping region 17. For instance, in the case of varying the doping amount of impurity element by separately performing ion implantation on each of the regions J, K, and L of the memory element array unit 11, the implantation mask needs to be formed three times.

Furthermore, as shown in FIG. 6B, after removing the implantation mask 36, heat treatment is performed to complete the doping of impurity element. The implantation mask can illustratively be made of photoresist, and can be removed by oxygen ashing after the ion implantation. The heat treatment can be omitted depending on the characteristics of the resistance change film 2.

Figure 7:
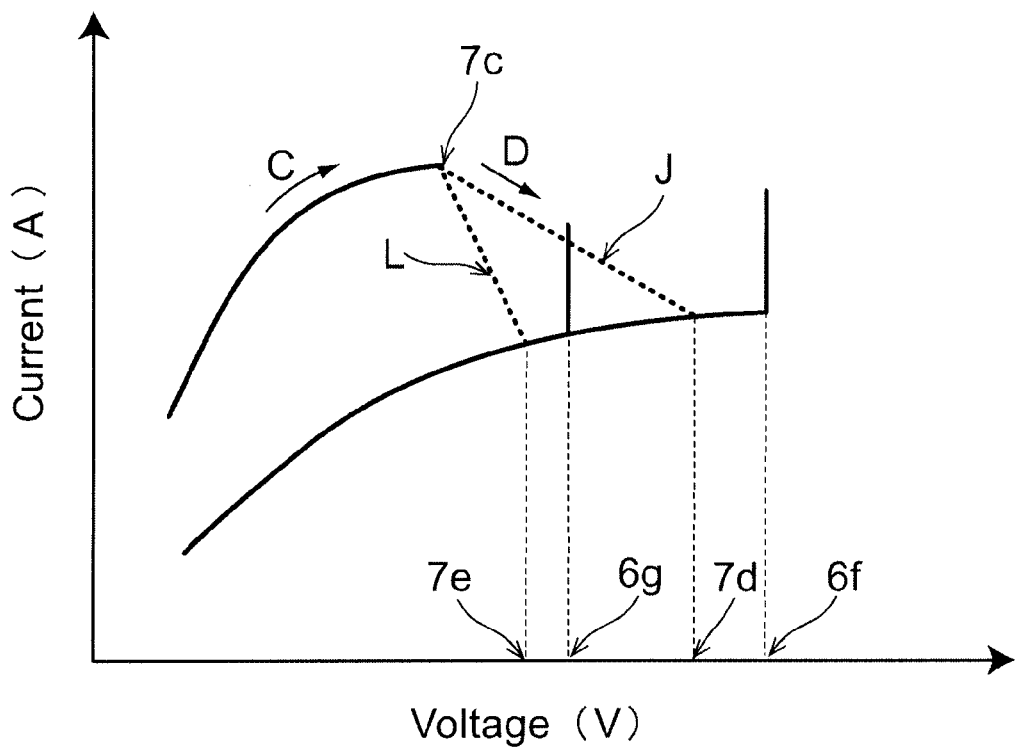
FIG. 7 is a schematic view showing the operation of the nonvolatile memory device according to a variation of this embodiment.

FIG. 7 is a schematic view showing the operation of a nonvolatile memory device 10 according to a variation of this embodiment. In the memory element 1 according to this variation, the reset voltage 7c is lower than the set voltage 6f for the resistance change film 2 not doped with impurity. Also in this case, it is desirable to factor in the effect of interconnection resistance on the voltage applied at reset time.

More specifically, as shown in FIG. 7, the reset waveform D of the resistance change film 2 in switching from the low resistance state to the high resistance state changes more gradually for the memory element 1 located in the region J with high interconnection resistance than for the memory element 1 located in the region L with low interconnection resistance. Hence, at reset time, the voltage 7d applied to the word line 12 connected to the memory element 1 located in the region J is higher than the voltage 7e applied to the word line 12 connected to the memory element 1 located in the region L.

On the other hand, in order to prevent malfunctions, it is desirable that the set voltage of the memory element 1 according to this variation be placed at a set voltage 6f higher than the voltages 7d and 7e applied to the word line 12 at reset time. However, if the set voltage 6f, for instance, higher than the voltage 7d is used for all the memory elements 1 located in the memory element array unit 11, then electrical power is wastefully consumed in the memory element 1 located in the region L, for instance.

In this context, as shown in FIG. 7, the power consumption can be reduced by decreasing the set voltage of the memory element 1 located in the region L from voltage 6f to voltage 6g. That is, in this variation, it is desirable that the amount of impurity element doped in the resistance change film 2 of the memory element 1 located in the region L be relatively large to decrease the set voltage to the voltage 6g. In contrast, in the memory element 1 located in the region K and the region J, the amount of impurity element doped in the resistance change film 2 is decreased in this order, thereby relatively increasing the set voltage. For instance, it is desirable that in the region J, the set voltage be placed at the voltage 6f without impurity doping, whereas in the region K, the set voltage be placed between the voltage 6f and the voltage 6g.

Thus, the power consumption of the nonvolatile memory device 10 according to this variation can be reduced. However, as a result, the voltage applied from the row decoder 15 to the word line 12 varies with the located region of the memory element 1 connected thereto, thus also causing a disadvantage of slowing down the operating speed at set time. Hence, it is desirable to control the amount of impurity doped in the resistance change film 2 of the memory element 1 in accordance with the purpose of the nonvolatile memory device 10.

Figure 8:
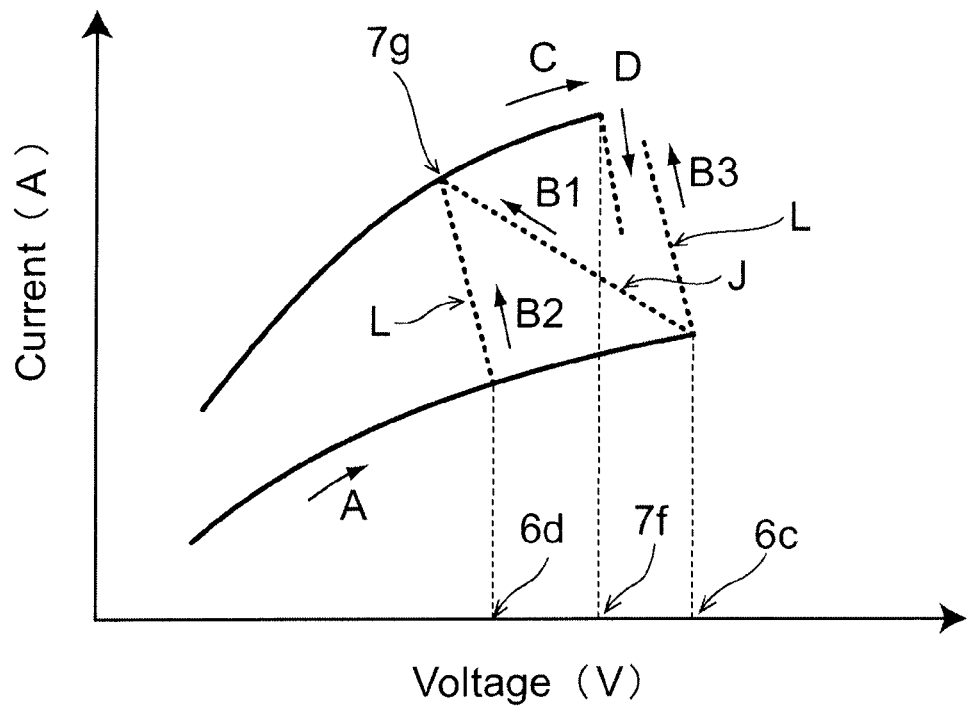
FIG. 8 is a schematic view showing the operation of the nonvolatile memory device according to another variation of the first embodiment.

FIG. 8 is a schematic view showing the operation of a nonvolatile memory device 10 according to another variation of this embodiment. In the memory element 1 shown in FIG. 8, the difference between the reset voltage 7f and the set voltage 6c of the resistance change film 2 is small. In this case, in the region J with high interconnection resistance, because of the large voltage drop in the interconnection, the voltage applied to the memory element 1 at set time changes along the waveform B1 shown in FIG. 8 and decreases to the voltage 7g. On the other hand, in the region L with low interconnection resistance, the voltage drop is small, and the voltage changes along the waveform B3. Consequently, at set time, the voltage applied to the memory element 1 may exceed the reset voltage 7f and cause malfunctions. In this context, it is desirable that the resistance change film 2 of the memory element 1 located in the region L be doped with impurity to decrease the set voltage to voltage 6d.

Thus, at set time, the voltage applied to the memory element 1 located in the region L changes along the waveform B2 from the voltage 6d to the voltage 7g. Hence, the risk of malfunctions can be eliminated. Furthermore, in order to achieve stable operation of the memory element 1, it is desirable to increase the difference between the set voltage 7f and the voltage 7g. In addition, if the voltage 7g of the region J with high interconnection resistance is made equal to that of the region L with low interconnection resistance, more stable operation can be achieved. Specifically, the region L can be doped with impurity by ion implantation to obtain a desired set voltage 6d.

Second Embodiment

Figure 9A:
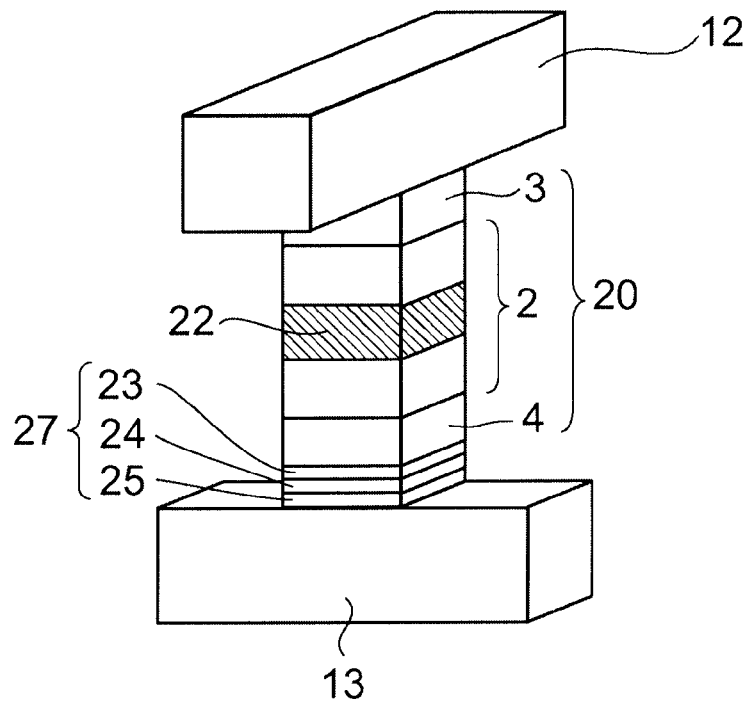
FIGS. 9A and 9B are schematic views showing a nonvolatile memory element according to a second embodiment.
Figure 9B:
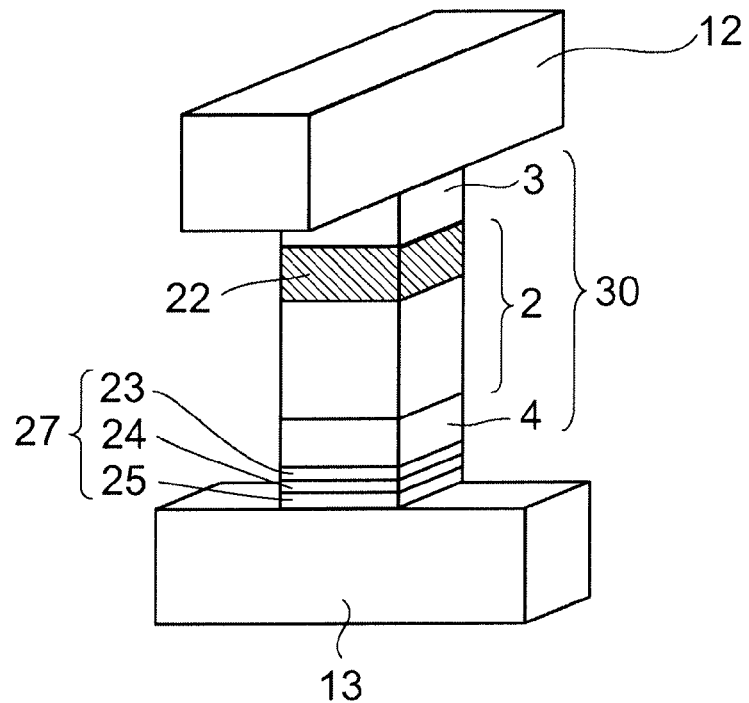

FIGS. 9A and 9B are schematic views showing a nonvolatile memory element according to a second embodiment.

The nonvolatile memory element according to this embodiment is illustratively a memory element 20. The memory element 20 includes a resistance change film 2 including an oxide film of Al or a transition metal, and an impurity doping region 22 provided in part of the resistance change film 2. The impurity doping region 22 is doped with an impurity element having a larger absolute value of standard Gibbs energy of oxide formation, or a larger atomic radius, than Al or the transition metal element contained in the oxide film of Al or the transition metal.

As shown in FIG. 9A, the impurity doping region 22 of the memory element 20 is provided in a central portion of the resistance change film 2. The resistance change film 2 is provided between an anode electrode 3 and a cathode electrode 4. A word line 12 is provided above the anode electrode 3. The cathode electrode 4 is provided on a bit line 13.

Furthermore, in this embodiment, a diode, such as a PIN diode 27, can be provided above the bit line 13. More specifically, as shown in FIG. 9A, a stacked structure of a P-type polysilicon layer 23, an I-type polysilicon layer 24, and an N-type polysilicon layer 25 is provided above the bit line 13.

FIG. 9B schematically shows a memory element 30 according to a variation of this embodiment. In the memory element 30, the impurity doping region 22 is provided near the anode electrode 3. Furthermore, as in FIG. 9A, a PIN diode 27 is provided above the bit line 13.

Next, the operation of the nonvolatile memory device is described with reference to FIG. 10.

Figure 10:
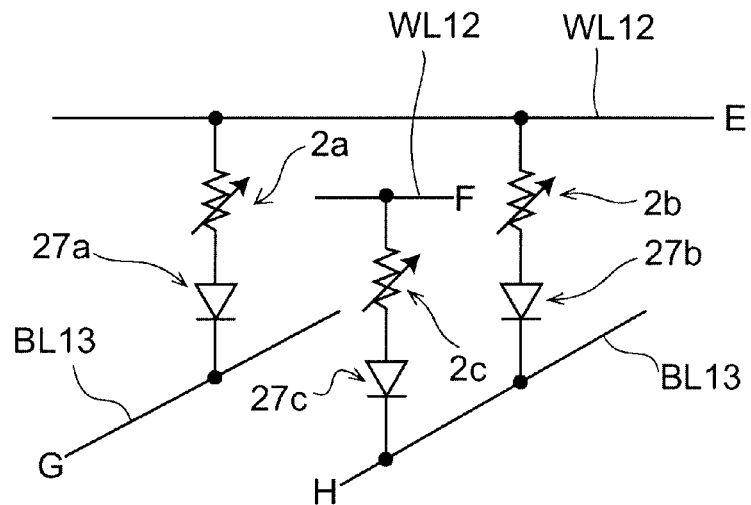
FIG. 10 is a circuit diagram showing part of the configuration of the nonvolatile memory device according to the second embodiment.

FIG. 10 is a circuit diagram showing part of the configuration of the nonvolatile memory device according to the second embodiment. For instance, two copies of the memory element 20 shown in FIG. 9A are connected to one word line E (WL12). The cathode electrode sides of the memory elements 20 are respectively connected to two bit lines G, H (BL13). Furthermore, another memory element 20 connected to a word line F and the bit line H is shown.

In the circuit configuration shown in FIG. 10, for instance, if the set voltage is applied from the row decoder 15 to the word line E, and the bit line G is placed at 0 V, then the resistance change film 2a switches to the low resistance state. At this time, the bit line H is applied with the same voltage as the word line E so that the resistance change film 2b, 2c of the other memory elements 20 is not turned to the low resistance state. The voltage of the word line F is 0 V because the word line F is not selected by the row decoder 15.

Consequently, the resistance change film 2b is not applied with voltage, and the resistance change film 2c is applied with a reverse bias equal in magnitude to the set voltage. At this time, the PIN diode 27c serves to block current flowing in the resistance change film 2c so that no voltage is applied thereto. That is, the PIN diode 27a, 27b, 27c is provided in order to prevent malfunctions in the nonvolatile memory device and reduce power consumption.

However, if the resistance change film 2 is doped with impurity element as shown in the first embodiment, the doped impurity element may diffuse into the stacked region 23-25 forming the PIN diode 27 and cause characteristics degradation. Thus, as in the memory element 20 and 30 shown in FIGS. 9A and 9B, an impurity doping region 22 is provided in part of the resistance change film 2 in the thickness direction. This can suppress diffusion of impurity element into the PIN diode 27.

In the memory element 20 shown in FIG. 9A, the impurity doping region 22 is provided in the central portion of the resistance change film 2. Hence, the impurity doping region 22 achieves its effect not only in the case where the PIN diode 27 is provided on the bit line 13 as shown in FIGS. 9A and 9B, but also in the case where the PIN diode 27 is provided on the word line 12 side. On the other hand, in the memory element 30 shown in FIG. 9B, the impurity doping region 22 is provided near the anode electrode 3. Hence, the diffusion of impurity element into the PIN diode 27 provided on the bit line 13 side can be suppressed more effectively.

In the memory element 30 shown in FIG. 9B, the decrease of the set voltage may be more noticeable. More specifically, the filament formed near the interface between the anode electrode 3 and the resistance change film 2 may govern the resistance change. Thus, the set voltage is decreased more effectively by providing the impurity doping region 22 near the anode electrode 3.

Figure 11A:
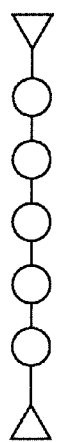
FIGS. 11A and 11B are flow charts showing a process for manufacturing the nonvolatile memory element according to the second embodiment.
Figure 11B:
Figure 12A:
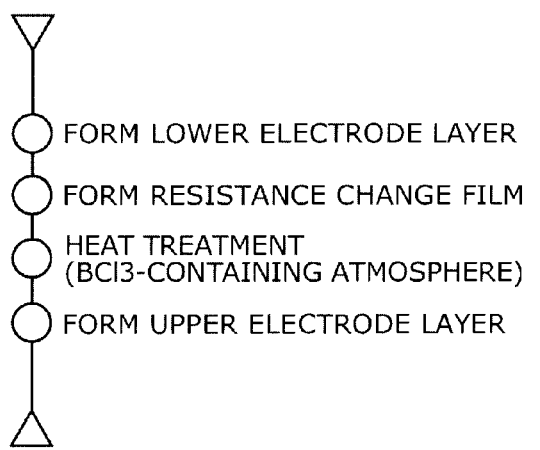
FIGS. 12A and 12B are flow charts showing a process for manufacturing the nonvolatile memory element according to a variation of the second embodiment.
Figure 12B:
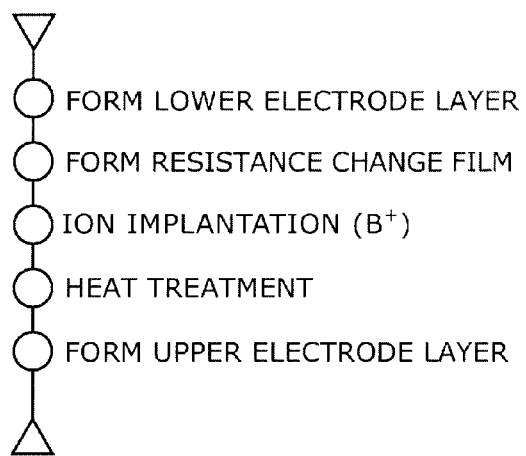

FIGS. 11A to 12B are flow charts showing a process for manufacturing a nonvolatile memory element according to the second embodiment. FIGS. 11A and 11B show a process for manufacturing the memory element 20. FIGS. 12A and 12B show a process for manufacturing the memory element 30.

In FIG. 11A, a lower electrode layer 4a is first formed, and a resistance change film 2 is formed thereon. Subsequently, heat treatment is performed in an atmosphere (for example, $BCl_3$) containing an impurity element (boron, B) to dope the resistance change film 2 with boron. Furthermore, the rest of the resistance change film 2 is formed, and an upper electrode layer 3a is formed to complete the process.

In FIG. 11B, instead of the heat treatment in FIG. 11A, ion implantation is used to dope an impurity element, boron. In this case, after completing the formation of the resistance change film 2, heat treatment is performed to activate boron.

In FIG. 12A, after forming a lower electrode layer 4a and a resistance change film 2, heat treatment is performed in an atmosphere containing an impurity element (boron, B) to dope the resistance change film 2 with boron. Furthermore, an upper electrode layer 3a is formed to complete the process.

In FIG. 12B, instead of the heat treatment in FIG. 12A, ion implantation is used to dope an impurity element, boron. Then, heat treatment is performed to activate boron.

In the above embodiment, unipolar operation is illustratively described, in which the polarity of the voltage applied to the memory element is the same of the set voltage and the reset voltage, however bipolar operation with different polarity is also possible. The memory element in this embodiment can be operated with a low voltage, and thus array operation is easily performed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

The invention claimed is:

1. A nonvolatile memory element comprising:
   an anode electrode;
   a cathode electrode;
   a resistance change film provided between the anode electrode and the cathode electrode, and capable of recording information by transitioning between a plurality of states having different resistances in response to at least one of a voltage applied to the resistance change film or a current passed through the resistance change film, the resistance change film including an oxide containing at least one element selected from the group consisting of Hf, Zr, Ni, Ta, W, Co, Al, Fe, Mn, Cr, and Nb; and
   an impurity element contained in the resistance change film being at least one element selected from the group consisting of Mg, Ca, Sr, Ba, Sc, Y, La, V, Ta, B, Ga, In, TI, C, Si, Ge, Sn, Pb, N, P, As, Sb, Bi, S, Se, and Te, the impurity element having an atomic radius larger than an atomic radius of the element contained in the oxide, and a doping amount of the impurity element being $1\times10^{14}$ $cm^{-2}$ or more,
   wherein a set voltage of the resistance change film is smaller than a reset voltage of the resistance change film, the set voltage changing a state of the resistance change film from a high resistance state to a low resistance state, and the reset voltage changing a state of the resistance change film from the low resistance state to the high resistance state.

2. The element according to claim 1, wherein the resistance change film includes an impurity doping region doped with the impurity element.

3. The element according to claim 2, wherein the impurity doping region is provided in a central portion of the resistance change film.

4. The element according to claim 1, wherein the impurity element is different in valence from the element contained in the oxide.

5. The element according to claim 1, wherein the impurity element is lower in covalency than the element contained in the oxide.

6. The element according to claim 1, wherein the oxide is a binary oxide represented by $M_xO_y$ (M: metal, O: oxygen).

7. The element according to claim 1, wherein the oxide is a ternary metal oxide represented by $A_\alpha M_\beta O_\gamma$ (A, M: metals, O: oxygen).

8. A nonvolatile memory device comprising:
   a plurality of the nonvolatile memory elements, each of the nonvolatile memory elements comprising:
      an anode electrode;
      a cathode electrode
      a resistance change film provided between the anode electrode and the cathode electrode, and capable of recording information by transitioning between a plurality of states having different resistances in response to at least one of a voltage applied to the resistance change film or a current passed through the resistance change film, the resistance change film including an oxide containing at least one element selected from the group consisting of Hf, Zr, Ni, Ta, W, Co, Al, Fe, Mn, Cr, and Nb; and
      an impurity element contained in the resistance change film being at least one element selected from the group consisting of Mg, Ca, Sr, Ba, Sc, Y, La, V, Ta, B, Ga, In, TI, C, Si, Ge, Sn, Pb, N, P, As, Sb, Bi, S, Se, and Te, the impurity element having an atomic radius larger than an atomic radius of the element contained in the oxide, and doping amount of the impurity being $1\times10^{14}$ $cm^{-2}$ or more,
      wherein a set voltage of the resistance change film is smaller than a reset voltage of the resistance change film, the set voltage changing a state of the resistance change film from a high resistance state to a low resistance state, and the reset voltage changing a state of the resistance change film from the low resistance state to the high resistance state, and wherein the anode electrode and the cathode electrode are configured to provide the resistance change film with at least one of the voltage or the current.

9. The device according to claim 8, wherein the resistance change film includes an impurity doping region being doped with the impurity element, and the impurity doping region is provided near the anode electrode.

10. The device according to claim 8, wherein the anode electrode and the cathode electrode contain at least one element of W, Ta, Cu, or Si.

11. The device according to claim 8, wherein the anode electrode and the cathode electrode contain at least one of TiN, TaN, or WC.

12. The device according to claim 8, further comprising:
a row decoder configured to write data to the nonvolatile memory elements;
a sense amplifier configured to read data from the nonvolatile memory elements; and
a plurality of interconnections electrically connecting between the row decoder and the sense amplifier via the nonvolatile memory elements.

13. The device according to claim 8, further comprising:
a row decoder configured to write data to the nonvolatile memory elements;
a sense amplifier configured to read data from the nonvolatile memory elements; and
a plurality of interconnections electrically connecting between the row decoder and the sense amplifier via the nonvolatile memory elements,
wherein a concentration of the impurity element in the nonvolatile memory element connected to the interconnection having a relatively high interconnection resistance is relatively higher than a concentration of the impurity element in the nonvolatile memory element connected to the interconnection having a relatively low interconnection resistance.

14. The device according to claim 13, wherein the nonvolatile memory elements are stacked in multiple layers.

15. The device according to claim 13, wherein
the nonvolatile memory elements include an anode electrode and a cathode electrode configured to provide the resistance change film with at least one of the voltage or the current, and
a diode is provided between the interconnections and the cathode electrode.

16. The device according to claim 8, further comprising:
a row decoder configured to write data to the plurality of nonvolatile memory elements;
a sense amplifier configured to read data from the plurality of nonvolatile memory elements; and
a plurality of interconnections electrically connecting the row decoder and the sense amplifier via the nonvolatile memory elements,
a concentration of the impurity element in the nonvolatile memory element connected to the interconnection having a relatively low interconnection resistance is relatively higher than a concentration of the impurity element in the nonvolatile memory element connected to the interconnection having a relatively high interconnection resistance.

17. The device according to claim 16, wherein the nonvolatile memory elements are stacked in multiple layers.

18. The device according to claim 16, wherein
the nonvolatile memory elements include an anode electrode and a cathode electrode configured to provide the resistance change film with at least one of the voltage or the current, and
a diode is provided between the interconnections and the cathode electrode.

* * * * *